United States Patent
Fox et al.

(10) Patent No.: US 8,902,681 B2
(45) Date of Patent: *Dec. 2, 2014

(54) SETTING A REFERENCE VOLTAGE IN A MEMORY CONTROLLER TRAINED TO A MEMORY DEVICE

(75) Inventors: Benjamin A. Fox, Rochester, MN (US); William P. Hovis, Rochester, MN (US); Thomas W. Liang, Rochester, MN (US); Paul W. Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/472,891

(22) Filed: May 16, 2012

(65) Prior Publication Data

US 2012/0224436 A1 Sep. 6, 2012

Related U.S. Application Data

(63) Continuation of application No. 12/815,739, filed on Jun. 15, 2010, now Pat. No. 8,289,784.

(51) Int. Cl.
*G11C 7/22* (2006.01)
*G11C 29/02* (2006.01)
*G06F 1/32* (2006.01)
*G11C 29/50* (2006.01)

(52) U.S. Cl.
CPC ............ *G11C 29/02* (2013.01); *G06F 1/3296* (2013.01); *G11C 29/028* (2013.01); *G11C 29/025* (2013.01); *G11C 29/022* (2013.01); *G11C 29/50008* (2013.01)
USPC ................................. 365/189.17; 365/189.09

(58) Field of Classification Search
USPC ............ 365/189.09, 189.11, 233.13, 189.17, 365/230.06, 86; 326/30, 83
See application file for complete search history.

(56) References Cited

U.S. PATENT DOCUMENTS

| | | | |
|---|---|---|---|
| 6,049,221 A | 4/2000 | Ishibashi et al. | |
| 6,130,836 A | 10/2000 | Matsubara et al. | |
| 6,330,194 B1 | 12/2001 | Thomann et al. | |
| 6,414,525 B2 | 7/2002 | Urakawa | |
| 6,445,316 B1 * | 9/2002 | Hsu et al. | 341/120 |

(Continued)

FOREIGN PATENT DOCUMENTS

| | | |
|---|---|---|
| EP | 1211691 A2 | 6/2002 |
| EP | 0833347 B1 | 12/2005 |

OTHER PUBLICATIONS

U.S. Appl. No. 12/815,739; Non-Final Office Action dated Feb. 7, 2012; 10 pages.

(Continued)

*Primary Examiner* — Vanthu Nguyen
(74) *Attorney, Agent, or Firm* — Toler Law Group

(57) ABSTRACT

Systems and methods to set a voltage value associated with a memory controller coupled to a memory device are disclosed. A particular method includes comparing test data of a test path to functional data of a functional path. The functional data may be generated based on device data received at a memory controller from a memory device. The test data may be affected by a voltage value applied to a resistor arrangement in electronic communication with the test path. The voltage value may be applied to the resistor arrangement based on the comparison.

20 Claims, 4 Drawing Sheets

(56) References Cited

U.S. PATENT DOCUMENTS

| | | | |
|---|---|---|---|
| 6,639,423 B2 | 10/2003 | Martin et al. | |
| 6,762,614 B2 | 7/2004 | Rearick et al. | |
| 6,807,650 B2 | 10/2004 | Lamb et al. | |
| 6,876,248 B2 * | 4/2005 | Nguyen et al. | 327/538 |
| 6,885,959 B2 * | 4/2005 | Salmon et al. | 702/107 |
| 6,958,942 B2 * | 10/2005 | Chang | 365/189.07 |
| 7,162,376 B2 * | 1/2007 | Oh et al. | 702/57 |
| 7,362,622 B2 | 4/2008 | Braun et al. | |
| 7,411,407 B2 | 8/2008 | Rearick et al. | |
| 7,439,761 B2 | 10/2008 | Mayer et al. | |
| 7,489,160 B2 * | 2/2009 | Kimura | 326/30 |
| 7,514,954 B2 | 4/2009 | Kim et al. | |
| 7,515,487 B2 | 4/2009 | Seo et al. | |
| 7,593,272 B2 | 9/2009 | Doyle et al. | |
| 7,710,144 B2 | 5/2010 | Dreps et al. | |
| 7,848,175 B2 | 12/2010 | Fox et al. | |
| 7,974,141 B2 | 7/2011 | Fox et al. | |
| 7,978,538 B2 | 7/2011 | Fox et al. | |
| 7,990,768 B2 | 8/2011 | Fox et al. | |
| 8,102,724 B2 | 1/2012 | Fox et al. | |
| 8,111,564 B2 | 2/2012 | Fox et al. | |
| 8,233,336 B2 | 7/2012 | Mueller | |
| 8,289,784 B2 | 10/2012 | Fox et al. | |
| 8,384,423 B2 | 2/2013 | Nguyen et al. | |
| 2002/0149972 A1 | 10/2002 | Lamb et al. | |
| 2008/0272800 A1 | 11/2008 | Haig et al. | |
| 2010/0188908 A1 | 7/2010 | Fox et al. | |
| 2010/0188917 A1 | 7/2010 | Fox et al. | |
| 2010/0188919 A1 | 7/2010 | Fox et al. | |
| 2010/0192000 A1 | 7/2010 | Fox et al. | |
| 2011/0307671 A1 | 12/2011 | Fox et al. | |
| 2012/0182044 A1 | 7/2012 | Oh | |
| 2012/0224436 A1 | 9/2012 | Fox et al. | |

OTHER PUBLICATIONS

U.S. Appl. No. 12/815,739; Notice of Allowance dated Jun. 7, 2012; 5 pages.

U.S. Appl. No. 12/815,844; Final Office Action dated May 1, 2013; 9 pages.

U.S. Appl. No. 12/815,844; Non-Final Office Action dated Dec. 10, 2012; 8 pages.

Jedec Standard, "POD18—1.8 V Pseudo Open Drain I/O: JESD8-19", Dec. 2006, JEDEC Solid State Technology Association, Arlington, VA, pp. 1-8.

U.S. Appl. No. 12/361,719; Notice of Allowance dated Sep. 19, 2011; 9 pages.

U.S. Appl. No. 12/361,836; Non-Final Office Action dated Jun. 2, 2011; 7 pages.

U.S. Appl. No. 12/361,836; Notice of Allowance dated Sep. 29, 2011; 10 pages.

U.S. Appl. No. 12/361,836; Supplemental Notice of Allowability dated Nov. 8, 2011; 2 pages.

U.S. Appl. No. 12/361,976; Notice of Allowance dated Jul. 30, 2010; 6 pages.

U.S. Appl. No. 12/361,577; Non-Final Office Action dated Oct. 13, 2010; 9 pages.

U.S. Appl. No. 12/361,577; Notice of Allowance dated Mar. 22, 2011; 9 pages.

U.S. Appl. No. 12/361,592; Notice of Allowance dated Feb. 25, 2011; 8 pages.

U.S. Appl. No. 12/361,602; Notice of Allowance dated Mar. 3, 2011; 8 pages.

U.S. Appl. 12/815,844; Notice of Allowance dated Aug. 22, 2013; 9 pages.

* cited by examiner

SETTING A REFERENCE VOLTAGE IN A MEMORY CONTROLLER TRAINED TO A MEMORY DEVICE

I. CLAIM OF PRIORITY

This application is a continuation patent application of, and claims priority from, U.S. patent application Ser. No. 12/815,739, filed on Jun. 15, 2010 and entitled "Setting a Reference Voltage in a Memory Controller Trained to a Memory Device" which is incorporated by reference herein in its entirety for all purposes.

II. FIELD OF THE DISCLOSURE

The present disclosure relates to training impedance values associated with a memory device coupled to a memory controller.

III. BACKGROUND

In a memory bus, the impedances of a memory device and a memory controller can be trained against each other. The training may enable the memory bus to detect a data eye of a signal, such as a signal communicated over a link coupling the memory device to the memory controller. The data eye may include a point on the signal that (when located and sampled) may be used to identify an associated bit as being either a logical one or a zero. Training may include adjusting an operating parameter of the memory controller or the memory device. An illustrative operating parameter may include a voltage level associated with the signal.

Mismatching impedances of the memory device and the memory controller may reduce a width of the data eye, or timing margin, and compromise data accuracy.

IV. SUMMARY OF THE DISCLOSURE

In a particular embodiment, a method to set a voltage value associated with a memory controller coupled to a memory device is disclosed. The method may include comparing test data of a test path to functional data of a functional path. The functional data and the test data may be generated based on data received at a memory controller from a memory device. The test data may be affected by a voltage value applied to a resistor arrangement in electronic communication with the test path. The voltage value may be applied to the resistor arrangement based on the comparison.

In another embodiment, a method includes comparing test data and functional data. The test data and the functional data may be generated based on data received at a memory controller. A voltage maximum setting and a voltage minimum setting may be determined based on the comparison. A voltage value may be determined based on the voltage maximum setting and the voltage minimum setting, and a reference voltage may be determined based on the voltage value.

In another embodiment, an apparatus includes a memory controller coupled to a memory device and a resistor arrangement that includes at least one resistor. A functional path of the memory controller may include functional data generated based on device data received from the memory device. A test path in communication with the resistor arrangement may convey test data affected by a voltage value applied to the resistor arrangement. The memory controller may be configured to compare the test data based and the functional data and may set the voltage value based on the comparison.

Timing margins may be improved and impedance mismatches may be reduced by adjusting a reference voltage. Signal errors may be reduced and the speed at which a communication bus executes may increase.

Features that characterize embodiments are set forth in the claims annexed hereto and forming a further part hereof. However, for a better understanding of embodiments, and of the advantages and objectives attained through their use, reference should be made to the Drawings and to the accompanying descriptive matter.

V. BRIEF DESCRIPTION OF THE DRAWINGS

VI. DETAILED DESCRIPTION

A memory device and a memory controller linked via a data net may be trained using voltage value adjustment. A reference voltage of the memory controller may be set based on a driver impedance of the memory device and a termination impedance of the memory controller. A voltage may be applied to a resistor arrangement that includes a pair of unmatched (non-identical) resistors. The reference voltage may be set based on a high voltage value and a low voltage value. The high and low voltage values may be automatically updated as one or more test paths are monitored during operation.

The memory controller may increment or decrement voltages applied to the resistor arrangement to set the high and low voltage values. For example, the correctness of test path data may be determined based on data of a functional path. A percentage of time that correct data (or incorrect data) is read in the test data path may be determined by comparing the test data with the actual data, or functional data. For example, the data of the functional path may be used to determine if a one or a zero of the test path correctly corresponds to a one or zero of the functional path. At a point when the incorrect data of the test path switches (i.e., from a zero to a one, or from a one to a zero), the voltage value may be set correctly. A predetermined range, ratio, set point, or other criteria may be specified. For example, the low voltage value may be too low until some percentage of the data of the test path matches data of a functional path. The high and low voltage values may be set in this manner to generate the reference value.

Calibration may use alternating current and real time, functional data. Functional data may be compared to the test data to determine what, if any, adjustments to make to the reference voltage. The reference voltage may be automatically adjusted during operations. Signal errors and impedance mismatches may be reduced, and a speed at which a communication bus executes may increase. Variation in the impedances of the driver of the memory device and the termination device of the memory controller may be managed to increase the timing margin. For example, the reference voltage may be modified to produce an increased timing margin.

Figure 1:
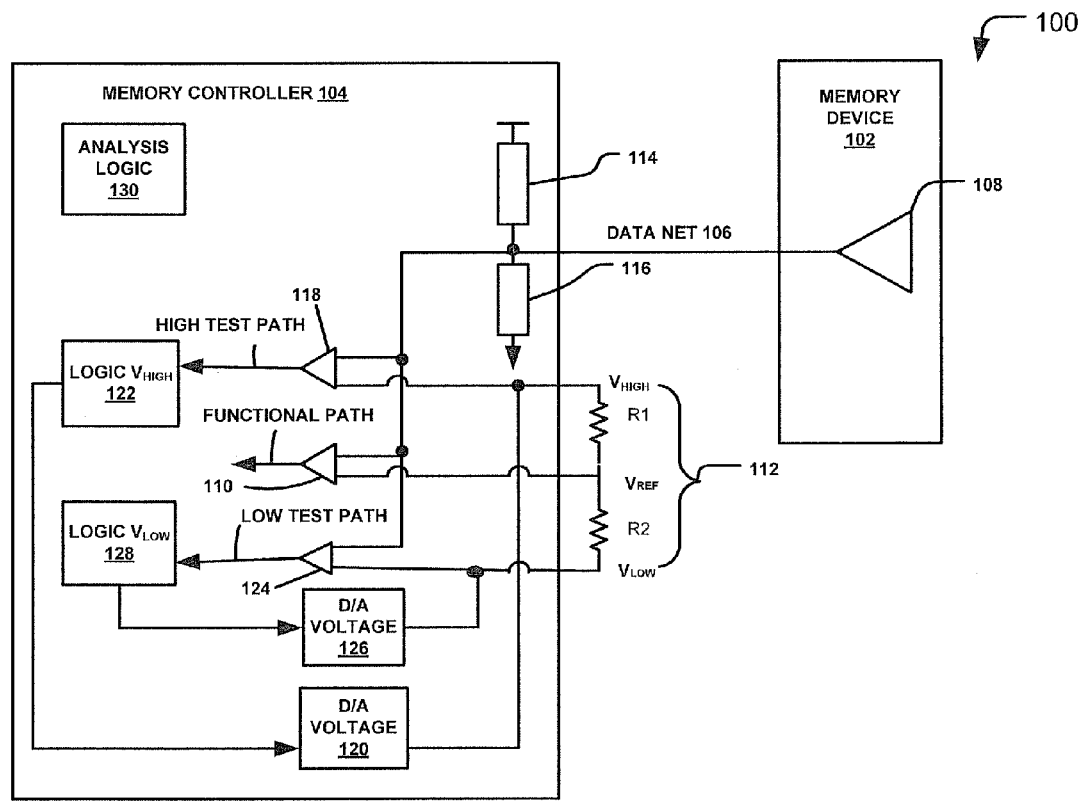
FIG. 1 is a block diagram of a system that includes a memory controller coupled to a memory device.

FIG. 1 shows an embodiment of a system 100 that includes a memory device 102 coupled to a memory controller 104 via a data net 106. An embodiment of the system 100 may include a communications bus. The data net 106 may comprise an interface used to train the memory device 102 and the memory controller 104 to each other to reduce impedance mismatches. The training may enable the system 100 to detect a data eye of an input signal, such as a signal communicated over the data net 106. The data eye may include a point on the signal that (when located and sampled) may be used to identify an associated bit as being either a logical one or a zero. Training may include adjusting an operating parameter of the memory controller 104 or the memory device 106. An illustrative operating parameter may include a voltage level. For example, the training may include setting a reference voltage ($V_{ref}$) associated with the memory controller 104. The reference voltage may be based on driver and termination impedances. A high voltage value ($V_{high}$) and a low voltage value ($V_{low}$) used to set the reference voltage may be automatically determined and updated. The reference voltage may be set before and updated during operation.

More particularly, the data net 106 may couple a driver 108 of the memory device 102 to an input port of a comparator 110 of the memory controller 104. A second input of the comparator 110 may be coupled to a resistor arrangement 112. The resistor arrangement 112 may provide the reference voltage to the second input of the comparator 110. The resistor arrangement 112 may include a first resistor, R1, associated with the high voltage value. The resistor arrangement 112 may further include a second resistor, R2, associated with the low voltage value. The high and low voltage values may be applied to the resistor arrangement 112 to set the reference voltage to a level that optimizes data margin. The output of the comparator 110 may be coupled to a functional path associated with a functional device (not shown).

The memory controller 104 may further include a comparator 118 associated with a high test path. The comparator 118 may include a first input that is coupled to the data net 106. A second input of the comparator 118 may be coupled to the resistor arrangement 112 at the high voltage value. An output of the comparator 118 may include the high test path. The high test path may be coupled to $V_{high}$ logic 122 configured to determine the high voltage value. The $V_{high}$ logic 122 may be coupled to a digital-to-analog (D/A) voltage device 120. The $V_{high}$ logic 122 may be configured to instruct the D/A voltage device 120 to selectively increment or decrement the high voltage value.

The memory controller 104 may additionally include a comparator 124 associated with a low test path. A first input of the comparator 124 may include the data net 106. A second input of the comparator 124 may be coupled to a low voltage portion of the resistor arrangement 112. The output of the comparator 124 may arrive at logic 128 configured to determine the low voltage value. The logic 128 may be configured to instruct a D/A voltage generator 126 to incrementally lower or raise the low voltage value. The memory controller 104 may be configured to monitor the high test path, low test path, and functional path to adjust the high and low voltage readings that determine the reference voltage.

The data net 106 may be coupled to a high voltage termination device 114 and a low termination device 116 of the memory controller 104. The data net 106 may include an alternating current and may communicate device data from the memory device 102. A termination device may include a load impedance to match line impedance and reduce signal reflection along the data net 106.

The memory controller 104 may further include analysis logic 130. The analysis logic 130 may be configured to determine the high and low voltage values used to generate the reference voltage. For example, the analysis logic 130 may be configured to calculate the low voltage value based on determined $V_{low}$ minimum and $V_{low}$ maximum settings. The high voltage value may be calculated using the determined $V_{high}$ minimum and $V_{high}$ maximum settings.

An illustrative memory device 102 may include a Dynamic Random Access Memory (DRAM) memory device, such as a Graphics Double Data Rate (GDDR) DRAM. The memory controller 104 may be located within any type of computer system including, but not limited to a desktop computer, a server, a laptop, a handheld device, a tablet personal computer, a set-top box, or another type of computer system that utilizes system memory. Within the computer system, the memory controller 104 may be located in a chipset, in one or more processors coupled to the chipset, or in a discrete component coupled to the system memory. The data net 106 may include one or more links configured to transmit data between two components within a computer system.

Figure 2:
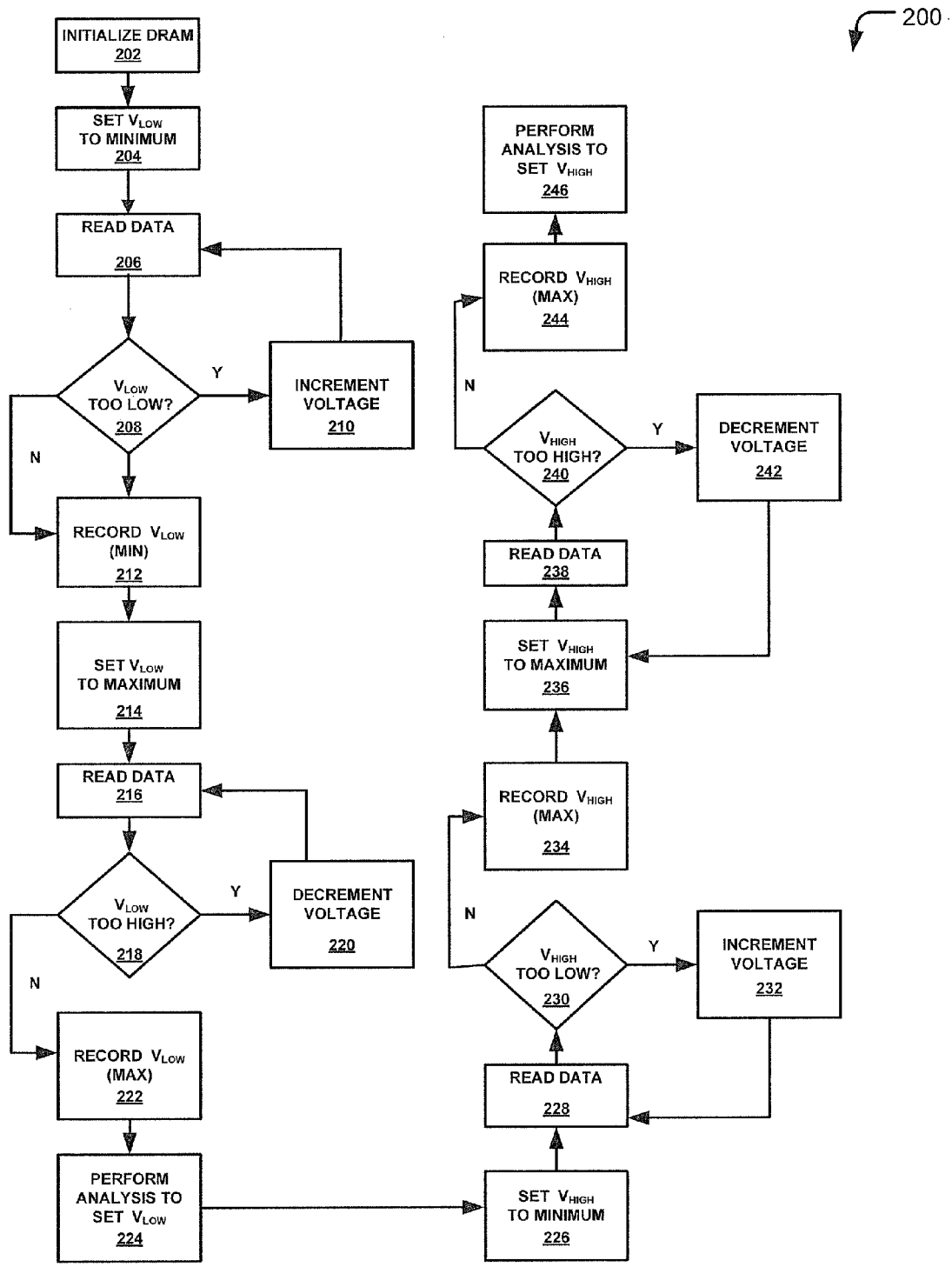
FIG. 2 is a flow diagram of a particular embodiment of a method to train a memory controller and a memory device during system startup.

FIG. 2 shows an embodiment of a method 200 for setting the high and low voltage values before a system becomes operational. For example, the high and low voltage values may be set during startup, or prior to the generation of functional data. Deterministic data (e.g., pseudo random test data patterns of data) may be used in the absence of the functional data. The method 200 may be performed by a memory controller, such as the memory controller 104 of FIG. 1, to initially determine the low voltage value based on calibrated $V_{low}$ minimum and $V_{low}$ maximum settings. Similarly, the high voltage value may be determined based on calculated $V_{high}$ minimum and $V_{high}$ maximum settings.

A first portion 202-212 of the method 200 may determine the $V_{low}$ minimum value by initially setting the low voltage value to a minimum value and by incrementing an applied voltage until a transition in the read data is detected. The determined $V_{low}$ minimum value may be used with the $V_{low}$ maximum setting to determine the low voltage value.

At 202, a DRAM may be initialized. For example, the memory device 202 of FIG. 1 may be initialized. The low voltage value may initially be set to a minimum level, at 204. For instance, the low voltage logic 128 of FIG. 1 may instruct the D/A voltage generator 126 to set the low voltage value to a low or the lowest voltage setting.

Data may be read, at 206. For example, deterministic data may be supplied at the driver 108 of FIG. 1 and communicated via the data net 106 to the memory controller 104. More particularly, the deterministic data may be supplied to the comparator 124 of the low test path. The $V_{low}$ logic 128 of FIG. 1 may monitor data received on the low test path from the comparator 124.

The low voltage logic may determine if the measured low voltage value is too low, at 208. The low voltage logic device 128 may determine if the low voltage value is too low based on a percentage of ones in the low test path that correspond to zeros of the deterministic data. The low voltage logic 128 may initially read all ones because the low voltage value is set to a minimum level. Such a reading may indicate that the low voltage value is too low. Alternatively, the low voltage value may be too high when the test path always includes the correct value (e.g., data always matching the deterministic data). For example, all zeros in the deterministic data may correspond to all zeros in the test path, and all ones in the deterministic data may correspond to all ones in the test path. A predetermined range, ratio, set point, or other criteria may be specified to facilitate the determination. For example, the low voltage value may be too low until some percentage of the data of the test path matches the deterministic data. An illustrative predetermined percentage may range from 30% to 70%. However, a range of another embodiment may span from 1% to 100%.

At 210, the low voltage value may be incremented. For example, the $V_{low}$ logic 128 of FIG. 1 may cause the D/A voltage generator 126 to increment the low voltage value. The low voltage value may continue to be incremented until the low voltage value is determined to not be too low, at 208. The low voltage value may not be too low when the $V_{low}$ logic 128 begins to detect a transition of ones to zeros within the read data. At this point, the low voltage value generated by the D/A voltage generator 126 may have the same (or nearly the same) voltage as is present on the data net 106 when a zero is read from the memory device 102. The low voltage value may be recorded as the $V_{low}$ minimum setting, at 212. For example, the $V_{low}$ logic 128 of FIG. 1 may record the $V_{low}$ minimum setting.

A second portion 214-222 of the method 200 may be associated with determining the $V_{low}$ maximum setting. The $V_{low}$ maximum setting may be processed in combination with the $V_{low}$ minimum setting to determine the low voltage value. At 214, the low voltage value may be set to a maximum level. For instance, the $V_{low}$ logic 128 of FIG. 1 may cause the D/A voltage generator 126 to generate a maximum level of voltage.

Data may be read at 216. For example, the driver 108 of FIG. 1 may communicate the deterministic data via the data net 106 to the comparator 124. At 218, a determination may be initiated as to whether the low voltage value is too high. The low voltage value may be too high where data read by the $V_{low}$ logic 128 includes all zeros that correspond to ones in the deterministic data. When the low voltage value is too high, the voltage value may be decremented, at 220. For instance, the $V_{low}$ logic 128 of FIG. 1 may cause the D/A voltage generator 126 to decrement the low voltage value. The low voltage value may be decremented until the $V_{low}$ logic 128 detects a transition of zeros to ones in the low test path. The $V_{low}$ maximum setting may be recorded, at 222. For example, the $V_{low}$ logic 128 of FIG. 1 may record the $V_{low}$ maximum setting at the D/A voltage generator 126.

At 224, analysis may be performed to determine the low voltage value. For example, the analysis logic 130 of the memory controller 104 of FIG. 1 may determine the low voltage value using the recorded $V_{low}$ minimum and $V_{low}$ maximum settings. For instance, the calculated low voltage value may include an average of the $V_{low}$ maximum setting and the $V_{low}$ minimum setting.

A third portion 226-234 of the method 200 may be associated with determining and recording a $V_{high}$ minimum value. The $V_{high}$ minimum value may be determined by initially setting the high voltage value to a minimum level and by incrementing the D/A voltage until a transition or other predetermined condition is detected. The $V_{high}$ minimum value may be used to determine the high voltage value that is used to set the reference voltage.

At 226, the high voltage value may be set to a minimum level. For example, the $V_{high}$ logic 122 of FIG. 1 may instruct the D/A voltage generator 120 to set the high voltage value at a minimum level. Data may be read, at 228. For instance, the $V_{high}$ logic 122 of FIG. 1 may read deterministic data from the high test path. The high test path may be generated by the comparator 118, which may receive an input from the data net 106 that includes the deterministic data.

The high voltage value may be determined to be too low, at 230. For instance, the $V_{high}$ logic 122 of FIG. 1 may determine that the high test path output from the comparator 218 always matches the functional data. A percentage of the zeros read from the high test path may correspond to zeros in the known deterministic data. The high voltage value may be incremented, at 232. For example, the $V_{high}$ logic 122 of FIG. 1 may cause the D/A voltage generator 120 to increment the high voltage value. The high voltage value may be incremented in this manner until the $V_{high}$ minimum setting is recorded, at 234. For instance, the $V_{high}$ logic 122 of FIG. 1 may record the $V_{high}$ minimum setting that corresponds to the transition in the high path test data when the high voltage value is no longer too low.

A fourth portion 236-242 of the method 200 may correspond to processes for determining a $V_{high}$ maximum setting. The $V_{high}$ maximum setting may be determined by setting the high voltage value to a maximum level and by decrementing the D/A voltage until a data transition in the high test path is detected. The $V_{high}$ maximum setting may be used to determine the high voltage value that is used to set the reference voltage.

At 236, $V_{high}$ may be set to a maximum level. For example, the $V_{high}$ logic 122 of FIG. 1 may cause the D/A voltage generator 120 to maximize the $V_{high}$ voltage. Deterministic data may be read, at 238. For example, the $V_{high}$ logic 122 of FIG. 1 may read data of the high test path.

The high voltage value may be determined to be too high, at 240. For instance, the $V_{high}$ logic 122 may determine that the high voltage value is too high where a zero is read in every instance that corresponds to a one in the deterministic data. At 242, the D/A voltage may be decremented until the high voltage value is no longer too high. For example, the $V_{high}$ logic 122 of FIG. 1 may cause the D/A voltage generator 120 to decrement the high voltage level.

The $V_{high}$ maximum setting may be recorded, at 244. For instance, the $V_{high}$ logic 122 of FIG. 1 may record the $V_{high}$ maximum setting at the D/A voltage generator 120 at a point when a transition in the read data is detected. For example, a predetermined percentage of ones that correspond to ones of the deterministic data may be detected. At 246, analysis may be performed to set the high voltage value. For instance, the analysis logic 130 of FIG. 1 may average the recorded $V_{high}$ minimum value and the recorded $V_{high}$ maximum setting to determine the high voltage value.

FIG. 2 thus shows an embodiment of a method 200 for setting the high and low voltage values using an alternating current-based test at system startup. The high and low voltage values may be used to set the voltage reference 112 of FIG. 1. The adjustment of the high and low voltage values may reduce the effects of impedance mismatches by adjusting the reference voltage to yield improvements in timing margins.

Figure 3:
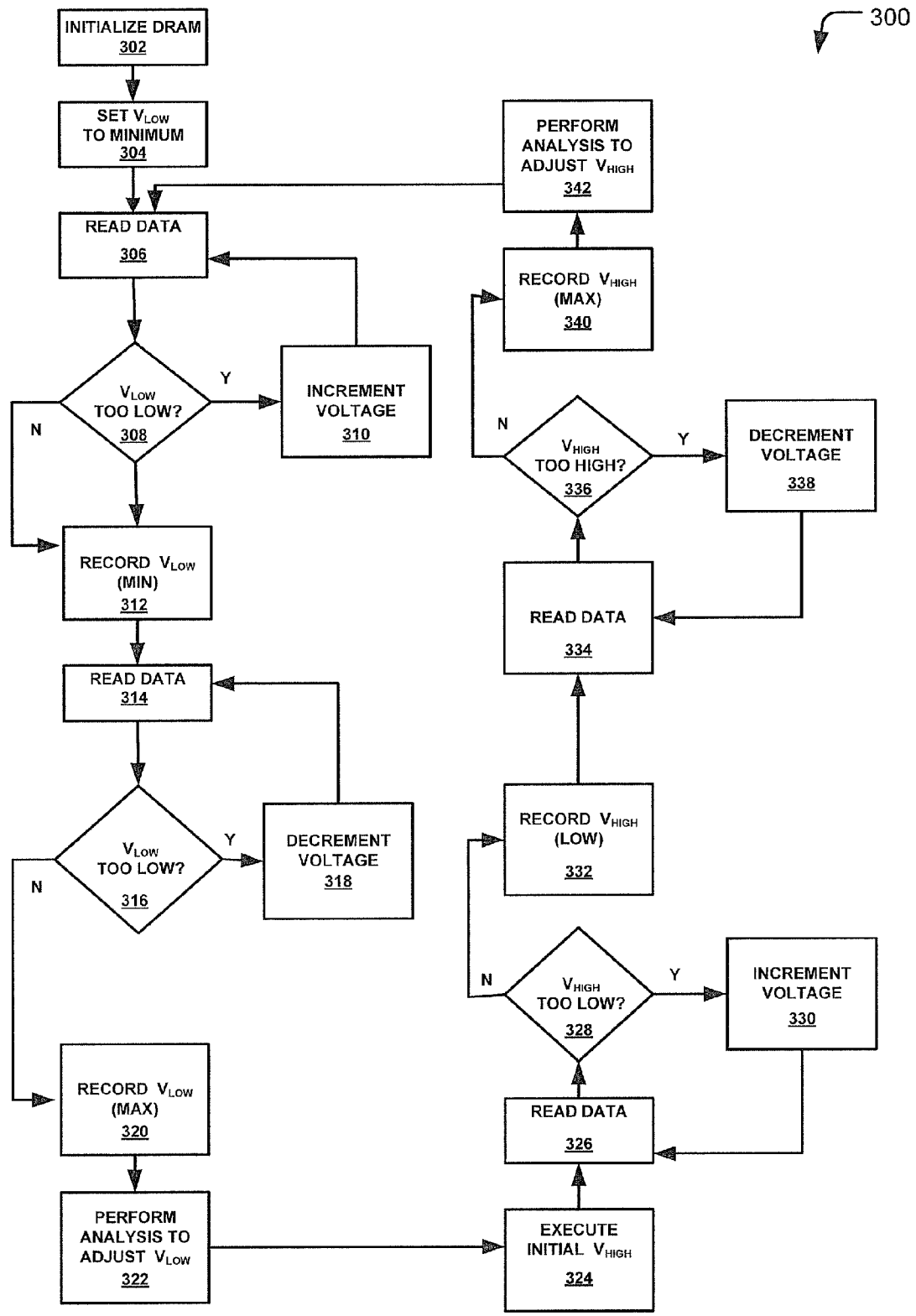
FIG. 3 is a flow diagram of a particular embodiment of a first method to train a memory controller and a memory device during system operation.

FIG. 3 shows an embodiment of a method 300 for adjusting the high and the low voltage values using an alternating current test during system operation. Data may be read and compared to functional data in real time, while the system is running A memory controller, such as the memory controller 104 of FIG. 1, may execute the method 300 to compare test path data to functional data transmitted along the functional path. When the calculated high and low voltage values differ from the initial high and low voltage values, the high and the low voltage values may be updated without interrupting operations.

At 302, a DRAM may be initialized. For example, the memory device 202 of FIG. 1 may be initialized. An initial low voltage value may be set, at 304. For instance, the low voltage logic 128 of FIG. 1 may instruct the D/A voltage generator 126 to initially set the low voltage value. As such, a first portion 302 and 304 of the method 300 may be accomplished using the method 200 of FIG. 2.

A second portion 306-312 of the method 300 may be associated with adjusting the $V_{low}$ minimum setting. The determined $V_{low}$ minimum value may be used with the $V_{low}$ maximum setting to update the low voltage value. At 306, data may be read. For instance, functional data may be supplied at the driver 108 of FIG. 1 and communicated via the data net 106 to the comparator 124 of the low test path. The $V_{low}$ logic 128 of FIG. 1 may monitor data received on the low test path from the comparator 124. The monitoring may include multiple reads of the data (e.g., 50 reads).

The low voltage value may be determined to be too low, at 308. For example, the $V_{low}$ logic 128 may determine that the low voltage value is too low when all ones are read in the test data. Some of the ones in the test data may correspond to (not matching) ones in the functional data. As described above, the determination may use a predetermined range, threshold, ratio, or other criteria used to evaluate the number of not matching or matching data.

At 310, the voltage may be incremented until the low voltage value is no longer too low. For instance, the $V_{low}$ logic 128 of FIG. 1 may cause the D/A voltage generator 126 to increment voltage that corresponds to the low voltage value until the predetermined criteria is satisfied. At this point, the low voltage value generated by the D/A voltage generator 126 may have the same (or nearly the same) voltage as is present on the data net 106.

At 312, the $V_{low}$ minimum setting may be recorded. For example, the $V_{low}$ logic 128 of FIG. 1 may record the current setting of the D/A voltage generator 126 as the $V_{low}$ minimum value. The $V_{low}$ minimum setting may correspond to a setting where ones are present in the monitored data at an acceptable range or level that corresponds to ones in the functional data.

A third portion 314-320 of the method 300 may be associated with adjusting the $V_{low}$ maximum setting. The $V_{low}$ maximum setting may be determined by initially setting the low voltage value to a maximum level and by decrementing the D/A voltage until a transition or other predetermined condition is detected. The $V_{low}$ maximum setting may be processed in combination with the $V_{low}$ minimum setting to determine the low voltage value.

At 314, data may be read. For instance, the $V_{low}$ logic 128 of FIG. 1 may monitor the data output from the comparator 124 via the low test path. The comparator may receive functional data as an input via the data net 106. The data may be monitored multiple times.

The low voltage value may be determined to be too high, at 316. The low voltage value may be considered too high when all the low test path data matches the function path data. The read zeros may correspond to ones in the functional path data. At 318, the low voltage value may be decremented until the low path test data is no longer too high. For example, the $V_{low}$ logic 128 of FIG. 1 may cause the D/A voltage generator 126 to decrement the low voltage value. The low voltage value may be decremented until the $V_{low}$ logic 128 detects a difference between the functional path data and the low test path data.

At 320, the $V_{low}$ maximum setting may be recorded. For instance, the $V_{low}$ logic 128 of FIG. 1 may record the voltage setting of the D/A voltage generator 126 as being the $V_{low}$ maximum setting. The $V_{low}$ maximum setting may be recorded at a point when the low path test data is no longer too high.

At 322, analysis may be performed to adjust the low voltage value. For example, the analysis logic 130 of the memory controller 104 of FIG. 1 may perform analysis to see if the low voltage value should be adjusted. The new, or adjusted, low voltage value may be based on the recorded $V_{low}$ minimum and $V_{low}$ maximum settings. For instance, the low voltage value may be calculated as an average of the recorded $V_{low}$ minimum and $V_{low}$ maximum settings.

A fourth portion 324-332 of the method 300 may be associated with determining a $V_{high}$ minimum setting. The $V_{high}$ minimum setting may be determined by setting the high voltage value to a minimum level and incrementing the D/A voltage until the high test path data does not match the functional path data. The $V_{high}$ minimum setting may be used to determine the high voltage value that is used to set the reference voltage.

At 324, operations may be performed with an initial high voltage value setting.

For example, the $V_{high}$ logic 122 of FIG. 1 may cause the D/A voltage 120 to set $V_{high}$ to a setting of the initial high voltage value. The initial high voltage value may be determined using the method 200 of FIG. 2.

At 326, data may be read. For instance, the $V_{high}$ logic 122 of FIG. 1 may monitor data received via the high test path. The monitored test data may correspond to functional data transmitted over the functional path. As described above, the test data may be monitored over several cycles.

The high voltage value may be determined to be too low, at 328. For example, the $V_{high}$ logic 122 of FIG. 1 may determine that the high voltage value is too low because the high test data always matches the functional path data. As described above, the determination may use a predetermined range, threshold, ratio, or other criteria associated with matched or unmatched data. At 330, the voltage may be incremented until a difference between the high test data and the functional path data is detected, or otherwise until the high voltage value is no longer too low. For example, the $V_{high}$ logic 122 may cause the D/A voltage generator 120 to increment the high voltage value until the predetermined criteria is satisfied. At this point, the high voltage value generated by the D/A voltage generator 120 may have the same (or nearly the same) voltage as is present on the data net 106.

The $V_{high}$ minimum setting may be recorded, at 332. For instance, the $V_{high}$ logic 122 of FIG. 1 may record the voltage setting at the D/A voltage generator 120 that corresponds to the $V_{high}$ minimum setting. The $V_{high}$ setting may correspond to a setting where zeros are present in the monitored data at an acceptable range or level that corresponds to zeros in the functional data.

A fifth portion 334-340 of the method 300 may be associated with adjusting the $V_{high}$ maximum setting during operation. The $V_{high}$ maximum setting may be determined by setting the high voltage value to a maximum level and by decrementing the D/A voltage until a transition in the high test path data is detected. The $V_{high}$ maximum setting may be used (along with the $V_{high}$ minimum setting) to determine the high voltage value that is used to set the reference voltage.

At 334, test data may be read. For example, the $V_{high}$ logic 122 of FIG. 1 may monitor data received via the high test path. The monitored test data may correspond to functional data transmitted over the functional path. As described above, the test data may be monitored over several cycles. At 336, the high voltage value may be determined to be too high. For example, the $V_{high}$ logic 122 of FIG. 1 may determine that the high voltage value is too high when all zeros are read in the test data. Some of the zeros in the test data may correspond to (not-matching) ones in the functional data. As described above, the determination may use a predetermined range, threshold, ratio, or other criteria.

At 338, the voltage may be decremented. For example, the $V_{high}$ logic 122 of FIG. 1 may cause the D/A voltage generator 120 to decrement the high voltage until the predetermined criteria is satisfied. For instance, a number of zeros that correspond to ones in the functional data may transition to ones. The $V_{high}$ maximum setting may be recorded, at 340. For example, the $V_{high}$ logic 122 of FIG. 1 may record the voltage setting at the D/A voltage generator 120.

At 342, analysis may be performed to adjust the $V_{high}$ setting. For example, the analysis logic 130 of FIG. 1 may determine if the high voltage value should be adjusted. The determination may be made by calculating an updated high voltage value that is based on the recorded $V_{high}$ minimum setting and the recorded $V_{high}$ maximum setting. In one example, an updated high voltage value may be determined by taking an average of the sum of the $V_{high}$ minimum setting and the Vhigh maximum setting.

FIG. 3 thus shows a first method 300 for setting the high and the low voltage values using an alternating current test during system operation. Data may be read and compared to functional data during real time. System operation may remain uninterrupted while the high and the low voltage values are selectively updated. The automatic updates to and $V_{high}$ may reduce impedance mismatches and offset issues.

Figure 4:
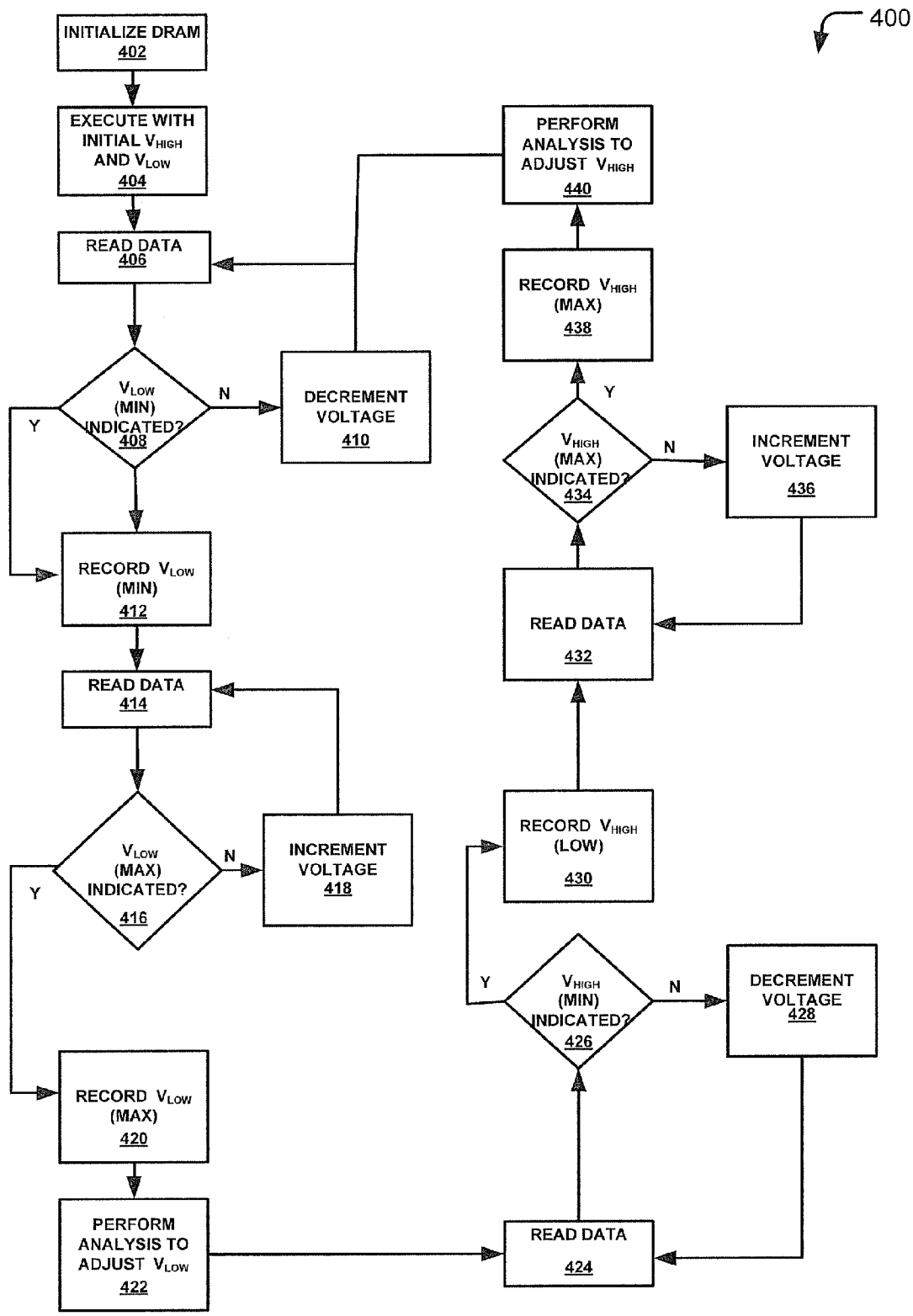
FIG. 4 is a flow diagram of a particular embodiment of a second method to train a memory controller and a memory device during system operation.

FIG. 4 shows an embodiment of a second method 400 for setting the high and the low voltage values during system operation. As with the method 300 of FIG. 3, the high voltage value may be set based on the $V_{high}$ minimum and $V_{high}$ maximum settings, and the low voltage value may be set based on the $V_{low}$ minimum and $V_{low}$ maximum settings. The method 400, however, may determine the above maximum and minimum settings by locating boundaries of the voltages ranges.

For instance, the $V_{low}$ minimum setting may correspond to a point when test data begins to be out of synchronization with the functional data (e.g., a low boundary). For example, the data in the test path may incorrectly read all ones, despite zeros being present in the functional data. At the high voltage boundary, the $V_{low}$ minimum setting may correspond to a point when test data begins to be synchronized with the functional data. For instance, all of the data in the test path may be correct, in view of the functional data. The $V_{high}$ minimum setting may include a setting when test data begins to be synchronized with the functional data. For example, all of the data in the test path may be correct, in view of the functional data. At the high voltage boundary, the $V_{high}$ minimum setting may correspond to a point when test data beings to be out of synchronization with the functional data. For instance, the test path may incorrectly read all zeros, despite ones being present in the functional data. The boundary calculations (i.e., $V_{high}$ minimum, $V_{high}$ maximum, $V_{low}$ minimum, and $V_{low}$ maximum) may be used to adjust the high and the low voltage values without interrupting operations.

At 402, a DRAM may be initialized. For example, the memory device 202 of FIG. 1 may be initialized. Initial high and low voltage values may be set, at 404. As such, a first portion 402 and 404 of the method 400 may be accomplished using the method 200 of FIG. 2.

A second portion 406-412 of the method 400 may be associated with adjusting the $V_{low}$ minimum setting. The $V_{low}$ minimum setting may include a point when test data begins to be out of synchronization with the functional data. The determined $V_{low}$ minimum value may be used with the $V_{low}$ maximum setting to update the low voltage value. At 406, data may be read. For example, functional data may be supplied at the driver 108 of FIG. 1 and communicated via the data net 106 to the comparator 124 of the low test path. The $V_{low}$ logic 128 of FIG. 1 may monitor data received on the low test path from the comparator 124. The monitoring may include multiple reads of the data (e.g., 50 reads).

A determination may be made as to whether the $V_{low}$ minimum setting is indicated, at 408. The $V_{low}$ minimum setting may correspond to a voltage value that results in the $V_{low}$ logic 128 reading all ones in the test data. The initial $V_{low}$ minimum setting may result in the test data including multiple zeros. The zeros in the test path may correctly correspond to zeros in the functional data. Where such zeros are detected in the test path, the low voltage value may be decremented, at 410. For instance, $V_{low}$ logic 128 of FIG. 1 may cause the D/A voltage generator 126 to decrement the voltage until a point when all ones are read in the test path. In another example, the $V_{low}$ minimum setting may be achieved when the number of detected ones in the test path corresponds to some other predetermined range, threshold, ratio, or other criteria used to evaluate the not-matching or matching data.

At 412, the $V_{low}$ minimum setting may be recorded. For example, the $V_{low}$ logic 128 of FIG. 1 may record the current setting of the D/A voltage generator 126 as the $V_{low}$ minimum value. The $V_{low}$ minimum setting may correspond to a setting when all or some other predetermined ratio of ones are read in the monitored data.

A third portion 414-420 of the method 400 may be associated with adjusting the $V_{low}$ maximum setting. The $V_{low}$ maximum setting may include a point when test data begins to be in synchronization with the functional data. At 414, data may be read. For example, the $V_{low}$ logic 128 of FIG. 1 may monitor the data output from the comparator 124 via the low test path. The comparator may receive functional data as an input via the data net 106. The data may be monitored multiple times.

A determination may be made as to whether the $V_{low}$ maximum setting is indicated, at 416. The $V_{low}$ maximum setting may correspond to a voltage value that results in the $V_{low}$ logic 128 reading matching data in the test path and in the functional path. The initial $V_{low}$ maximum setting may result in the test data including all ones. Some of the ones in the test path may incorrectly correspond to zeros in the functional data. When such incorrect ones are detected in the test path, the low voltage value may be incremented, at 418. For instance, $V_{low}$ logic 128 of FIG. 1 may cause the D/A voltage generator 126 to increment the voltage until a point when the data read in the test path matches the data read in the functional path. In another example, the $V_{low}$ maximum setting may be achieved when the number of detected zeros in the test path corresponds to some other predetermined range, threshold, ratio, or other criteria used to evaluate the not-matching or matching data. At 420, the $V_{low}$ maximum setting may be recorded. For example, the $V_{low}$ logic 128 of FIG. 1 may record the current setting of the D/A voltage generator 126 as the $V_{low}$ maximum value.

At 422, analysis may be performed to adjust the low voltage value. For example, the analysis logic 130 of the memory controller 104 of FIG. 1 may perform analysis to see if the low voltage value should be adjusted. The adjusted low voltage value may be based on the recorded $V_{low}$ minimum and $V_{low}$ maximum settings. For instance, the low voltage value may be calculated as an average of the recorded $V_{low}$ minimum and $V_{low}$ maximum settings.

A fourth portion 424-430 of the method 400 may be associated with determining a $V_{high}$ minimum setting. The $V_{high}$ minimum setting may include a point when test data begins to be synchronized with the functional data. For example, the data of the high test path may mirror the data of the functional path. At 424, data may be read. For instance, the $V_{high}$ logic

122 of FIG. 1 may monitor data received via the high test path. The monitored test data may correspond to functional data transmitted over the functional path. As described above, the test data may be monitored over several cycles.

A determination may be made as to whether the $V_{high}$ minimum setting is indicated, at 426. The $V_{high}$ minimum setting may correspond to a voltage value that results in the $V_{high}$ logic 122 reading data in the test path that is the same as data in the high test path. When the data in the high test path and the functional path do not match, the voltage value may be decremented, at 428. For example, $V_{high}$ logic 122 of FIG. 1 may cause the D/A voltage generator 120 to decrement the voltage until a point when the data matches. At 412, the $V_{high}$ minimum setting may be recorded. For instance, the $V_{high}$ logic 122 of FIG. 1 may record the current setting of the D/A voltage generator 120 as the $V_{high}$ minimum value. The $V_{high}$ minimum setting may correspond to a setting when all or some other predetermined ratio of matching data is read in the monitored data.

A fifth portion 432-340 of the method 400 may be associated with adjusting the $V_{high}$ maximum setting during operation. The $V_{high}$ maximum may include a point when test data begins to be out of synchronization with the functional data. The determined $V_{high}$ maximum value may be used with the $V_{high}$ minimum setting to update the low voltage value.

At 434, test data may be read. For example, the $V_{high}$ logic 122 of FIG. 1 may monitor data received via the high test path. The monitored test data may correspond to functional data transmitted over the functional path. As described above, the test data may be monitored over several cycles.

A determination may be made as to whether the $V_{high}$ maximum setting is indicated, at 434. The $V_{high}$ maximum setting may correspond to a voltage value that results in the $V_{high}$ logic 122 reading all zeros in the test data. The initial $V_{high}$ maximum setting may result in the test data including multiple ones. The ones in the test path may correctly correspond to ones in the functional data. When such ones are detected in the test path, the high voltage value may be incremented, at 436. For example, $V_{high}$ logic 122 of FIG. 1 may cause the D/A voltage generator 120 to increment the voltage until a point when all zeros are read in the test path. In another example, the $V_{high}$ maximum setting may be achieved when the number of detected zeros in the test path corresponds to some other predetermined range, threshold, ratio, or other criteria used to evaluate the not-matching or matching data.

At 438, the $V_{high}$ maximum setting may be recorded. For instance, the $V_{high}$ logic 122 of FIG. 1 may record the current setting of the D/A voltage generator 120 as the $V_{high}$ maximum value. The $V_{high}$ maximum setting may correspond to a setting when all or some other predetermined ratio of zeros are read in the monitored data.

At 440, analysis may be performed to adjust the high voltage value. For example, the analysis logic 130 of the memory controller 104 of FIG. 1 may perform analysis to see if the high voltage value should be adjusted. The adjusted high voltage value may be based on the recorded $V_{high}$ minimum and $V_{high}$ maximum settings. For instance, the high voltage value may be calculated as an average of the recorded $V_{high}$ minimum and $V_{high}$ maximum settings.

FIG. 4 thus shows a second method 400 for setting the high and the low voltage values using an alternating current test during system operation. The method 400 may enable larger timing margins and larger variation in the high and low voltage values than the method 300 of FIG. 1. Data may be read and compared to functional data during real time. System operation may remain uninterrupted while the high and the low voltage values are selectively updated. The automatic updates to $V_{low}$ and $V_{high}$ increase processing speed and data accuracy.

Particular embodiments can take the form of an entirely hardware embodiment, an entirely software embodiment, or an embodiment containing both hardware and software elements. Further, embodiments may take the form of a computer program product accessible from a computer-usable or computer-readable medium providing program code for use by or in connection with a computer or any instruction execution system. For the purposes of this description, a computer-usable or computer readable medium can be any apparatus that can contain, store, or communicate the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk, and an optical disk. Examples of optical disks include compact disc—read only memory (CD-ROM), compact disc—read/write (CD-R/W) and DVD. A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

While the present invention has been illustrated by a description of various embodiments and while these embodiments have been described in considerable detail, it is not the intention of the Applicants to restrict, or any way limit the scope of the appended claims to such detail. For example, calibration may be repeated as conditions change for maintenance of desired settings and performance. Unique settings may be saved for different conditions. As an example, a temperature change greater than a predetermined amount (e.g., twenty degrees Celsius) from the original or last calibration could initiate a calibration. Alternatively, the condition may initiate the retrieval of a previously stored set of calibration values associated with the new temperature. Other illustrative conditions may include the activation or deactivation of system components (e.g., another bus, an interface, or controller) that may impact the interface.

Further, while embodiments of the invention are described specifically for a GDDR3 interface from a memory controller to a GDDR3 memory device, the system and method described may be applied to any number of system and subsystem electrical communication buses. The invention in its broader aspects is therefore not limited to the specific details, representative apparatus, methods, and illustrative examples shown and described. Accordingly, departures may be made from such details without departing from the scope of Applicants' general inventive concept.

The invention claimed is:

1. A method of setting of voltage value associated with a memory controller coupled to a memory device, the method comprising:
 comparing test data of a test path to functional data of a functional path, wherein the functional data is generated based on device data received at a memory controller from a memory device, and wherein the test data is affected by a voltage value applied to a resistor arrangement in electronic communication with the test path; and
setting the voltage value applied to the resistor arrangement based on the comparison, wherein the test path is responsive to an alternating current.

2. The method of claim 1, wherein the test path is responsive to a comparator that receives the alternating current and an output of the resistor arrangement.

3. The method of claim 1, further comprising setting an initial level of the voltage value prior to generation of the functional data.

4. The method of claim 1, further comprising setting the voltage value when a result of the comparison deviates from predetermined criteria.

5. The method of claim 1, wherein the comparison includes determining a first number of bits in the test data that match corresponding digits in the functional data.

6. The method of claim 1, further comprising using the voltage value to set a reference voltage of the memory controller, wherein the voltage value includes one of a high voltage value and a low voltage value.

7. The method of claim 6, further comprising determining the high voltage value based on a high voltage minimum setting and a high voltage maximum setting.

8. The method of claim 6, further comprising determining the low voltage value based on a low voltage minimum setting and a low voltage maximum setting.

9. The method of claim 1, further comprising determining a high voltage minimum setting and a high voltage maximum setting associated with the voltage value.

10. The method of claim 1, further comprising determining a low voltage minimum setting and a low voltage maximum setting associated with the voltage value.

11. The method of claim 1, further comprising generating the functional data during operation of a communication bus comprising the memory controller and the memory device.

12. A method of setting of reference voltage associated with a memory controller coupled to a memory device, the method comprising:
comparing test data of a test path and functional data of a functional path, wherein the functional data is generated based on device data received at a memory controller from a memory device, and wherein the test data is affected by a voltage value applied to a resistor arrangement in electronic communication with the test path, and wherein the comparison includes determining a first number of bits in the test data that match corresponding digits in the functional data;
determining a voltage maximum setting and a voltage minimum setting based on the comparison;
determining the voltage value based on the voltage maximum setting and the voltage minimum setting; and
determining a reference voltage based on the voltage value.

13. The method of claim 12, further comprising comparing the test data to the functional data.

14. An apparatus, comprising:
a memory device;
a resistor arrangement; and
a memory controller coupled to the memory device and the resistor arrangement, the memory controller including:
a functional path including functional data generated based on device data received at the memory controller from the memory device; and
a test path in electronic communication with the resistor arrangement and including test data affected by a voltage value applied to the resistor arrangement;
wherein the memory controller is configured to:
compare the test data of the test path and the functional data of the function path, wherein the comparison includes determining a first number of bits in the test data that match corresponding digits in the functional data; and
set the voltage value applied to the resistor arrangement based on the comparison, wherein the test path is responsive to an alternating current.

15. The apparatus of claim 14, wherein the resistor arrangement includes a plurality of unmatched resistors.

16. The apparatus of claim 14, wherein the memory controller is configured to compare the test data to the functional data.

17. The apparatus of claim 14, wherein the memory device includes a graphics double data rate dynamic random access memory.

18. The apparatus of claim 14, wherein the memory controller is configured to set the voltage value when a result of the comparison deviates from predetermined criteria.

19. The apparatus of claim 14, wherein the voltage value is used to set a reference voltage of the memory controller, wherein the voltage value includes one of a high voltage value and a low voltage value.

20. The apparatus of claim 14, further comprising a data net configured to couple the memory device to the memory controller.

* * * * *